(12) United States Patent
Benwadih (10) Patent No.: US 11,903,322 B2
(45) Date of Patent: Feb. 13, 2024

(54) ELECTROMECHANICAL DEVICE BASED ON FERROELECTRIC POLYMERS AND METHODS OF MANUFACTURING SUCH A DEVICE

(71) Applicant: COMMISSARIAT À L'ENERGIE ATOMIQUE ET AUX ÉNERGIES ALTERNATIVES, Paris (FR)

(72) Inventor: Mohammed Benwadih, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 585 days.

(21) Appl. No.: 17/089,017

(22) Filed: Nov. 4, 2020

(65) Prior Publication Data

US 2021/0143317 A1    May 13, 2021

(30) Foreign Application Priority Data

Nov. 7, 2019   (FR) ........................... 1912493

(51) Int. Cl.
| | | |
|---|---|---|
| *H01L 41/047* | (2006.01) | |
| *H10N 30/857* | (2023.01) | |
| *H10N 30/06* | (2023.01) | |
| *H10N 30/098* | (2023.01) | |
| *H10N 30/87* | (2023.01) | |

(52) U.S. Cl.
CPC ........... *H10N 30/857* (2023.02); *H10N 30/06* (2023.02); *H10N 30/098* (2023.02); *H10N 30/877* (2023.02)

(58) Field of Classification Search
CPC ........................ H10N 30/857; H10N 30/877
USPC ....................................................... 310/357
See application file for complete search history.

(56) References Cited

U.S. PATENT DOCUMENTS

| 2008/0007140 A1 | 1/2008 | Izumi et al. |
| 2012/0200200 A1 | 8/2012 | Jung et al. |
| 2019/0286263 A1* | 9/2019 | Bagheri ............... G06F 3/0414 |

FOREIGN PATENT DOCUMENTS

| EP | 2323188 A2 | 5/2011 |
| EP | 2463926 A2 | 6/2012 |

OTHER PUBLICATIONS

Search Report for French application No. FR1912493 dated Jun. 24, 2020.

* cited by examiner

*Primary Examiner* — Derek J Rosenau
(74) *Attorney, Agent, or Firm* — Pearne & Gordon LLP (57) ABSTRACT

An electromechanical device comprising: first and second electrodes each comprising a metal layer; an active layer comprising at least one ferroelectric polymer and disposed between the first and the second electrode. The first electrode and the second electrode each comprise an interface layer comprising poly(3,4-ethylenedioxythiophene). Each interface layer is interposed between the active layer and the corresponding metal layer. The invention further relates to a method for manufacturing such a device.

15 Claims, 4 Drawing Sheets

ELECTROMECHANICAL DEVICE BASED ON FERROELECTRIC POLYMERS AND METHODS OF MANUFACTURING SUCH A DEVICE

TECHNICAL FIELD

The invention relates to the field of electromechanical devices based on organic material.

The object of the invention is thus more specifically an electromechanical device based on ferroelectric polymers and a method for manufacturing such an electromagnetic device.

Prior Art

In order to provide electromechanical devices, such as actuators or else pressure sensors, it is known to use electromechanical devices based on ferroelectric polymers. Such electromechanical devices are in particular particularly advantageous for equipping flexible printed circuits.

Figure 1:
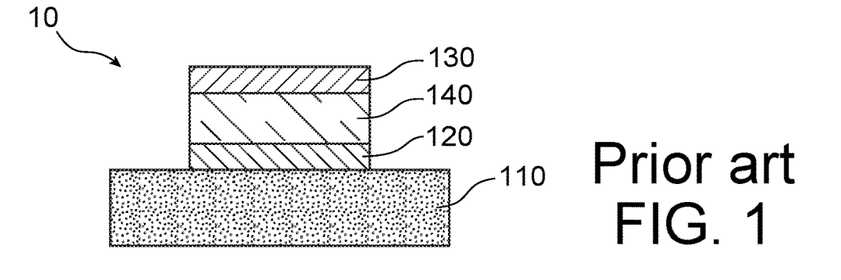
FIG. 1 illustrates in schematic sectional view a principle view of an electromechanical device according to the prior art.

Such an electromechanical device 10 generally includes, as illustrated in FIG. 1:
- a first metal electrode 120 disposed on a support 110, such as a glass or polyamide support,
- an active layer 140 comprising a ferroelectric polymer, such as a poly(vinylidene fluoride) or a poly(vinylidene-co-trifluoroethylene fluoride) copolymer,
- a second metal electrode 130.

The active layer 140 is arranged in electrical contact between the first and the second electrode 120, 130 in such a way as to allow, from said first and second electrodes 120, 130, to apply a potential difference thereto, in the case of an actuator application, or to allow to measure an electric field prevailing therein, in the case of a sensor application.

It will be noted that generally, in such an electromechanical device, in order to allow deformation of the active layer without breaking the connection of the electrodes, at least one of the first and of the second electrode includes at least one of the metal particles and metal wires.

Figure 2A:
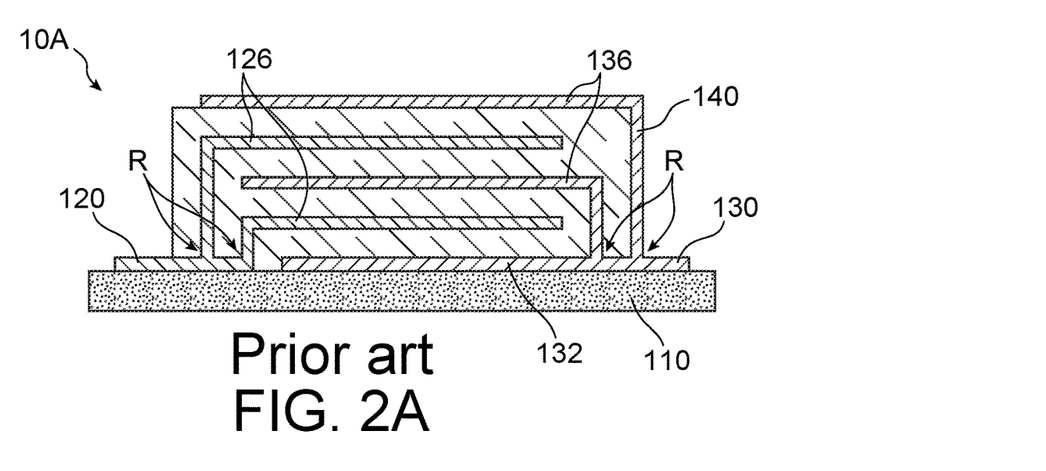
FIGS. 2A and 2B illustrate a sectional view of an electromechanical device according respectively to a first and a second configuration of the prior art.
Figure 2B:
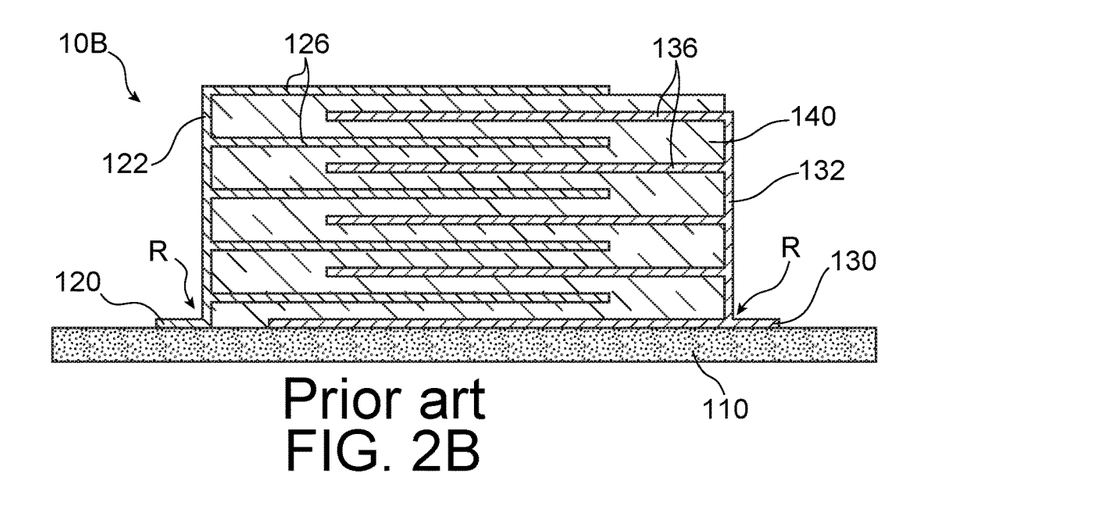

FIGS. 2 and 3 illustrate practical application examples for such electromechanical devices which allow their performance to be optimised by a "multi-stage" configuration of the active layer. These two examples are based on an active layer 140 including a plurality of portions each extending along a plane of the electromechanical device 10A 10B parallel to each other, the portions succeeding one another along a direction perpendicular to the plane of the device. Two successive portions of the active layer 140 are at least partially separated from each other by a metal intermediate electrode layer 126, 136 belonging to one of the first and the second electrode 120, 130 such that for two successive intermediate electrode layers 126, 136, one intermediate electrode layer 126 is comprised in the first electrode 120 and the other intermediate electrode layer 136 is comprised in the second electrode 230.

For the electromechanical device 10A according to the first practical application example, the first and the second electrode 120, 130 includes a contact portion 121, 122 extending partially under the active layer 140 from which extend the intermediate electrode layers 126, 136 with the outermost intermediate electrode layers surrounding the innermost intermediate electrode layers.

For the electromechanical device 10B according to the second practical application example, the first and the second electrode 120, 130 includes a lateral portion 122, 132 extending perpendicularly to the plane of the electromechanical layer, in order to connect each of the intermediate electrode layers 126, 136 corresponding to said electrode 120, 130.

While such electromechanical devices 10, 10A, 10B allow to obtain particularly advantageous electromechanical performance while ensuring adaptation to the flexible printed circuits, they nevertheless have a major disadvantage.

Indeed, such electromechanical devices are caused, by their function, to be subjected to significant deformations which generally lead to deterioration of the first and the second electrodes. This deterioration generates breaks in the connections of the electrodes at the locations indicated under the reference R in FIGS. 2 and 3 and the malfunction of these devices. As a result, such electromechanical devices do not have optimum reliability.

DESCRIPTION OF THE INVENTION

The invention aims at overcoming the above disadvantage and thus aims at providing an electromechanical device which is more reliable relative to the devices of the prior art To this end, the invention relates to an electromechanical device comprising:
- first and second electrodes, the first electrode comprising at least a first metal layer and the second electrode comprising at least a second metal layer,
- an active layer comprising at least one ferroelectric polymer, said active layer being disposed between the first and the second electrode in electrical contact with said first and second electrodes.

The first electrode and the second electrode respectively comprise a first and a second interface layer each comprising a poly(3,4-ethylenedioxythiophene), the first and the second interface layer being interposed between the active layer and respectively the first and the second metal layer.

The first and second interface layers are interposed between the active layer and respectively the first and second metal layer separating said active layer from said first and second metal layer.

The inventors have discovered that one of the causes of the deterioration of these electromagnetic devices is related to a reaction between the electrodes, in particular the possible solvent which they comprise, and the active layer. As a result of this reaction, the interface between the active layer and said electrodes is degraded upon formation of the electromechanical device. This degradation is then amplified during the operation of the electromechanical device and the application of the constraints which are related to this operation, until the appearance of the broken connections of the electrodes observed in the prior art.

The inventors have thus discovered that by integrating into these devices an interface layer each comprising a poly(3,4-ethylenedioxythiophene) between each metal layer of the first and the second electrode and the active layer, such that they do not come into contact with each other, it is possible to suppress the reactions between the electrodes and the active layer. This therefore results in an interface of better quality which is therefore less likely to be degraded during the operation of the device.

In addition, each of the interface layers is flexible, since they each comprise a poly(3,4-ethylenedioxythiophene), and therefore capable of absorbing part of the deformation transmitted by the active layer, thus reducing the stresses to which the first and the second electrodes are subjected as part of the operation of the electromagnetic device.

Therefore, the electromechanical device has increased reliability vis-à-vis electromagnetic devices of the prior art.

Each of the first and second interface layers may further comprise poly(sodium styrene sulfonate), or tetramethylacrylate and/or polyaniline.

In this way, it is possible to optimise the composition of the first and the second layer and thus to provide a first and a second layer adapted to the operating constraints of the electromechanical device.

The at least one ferroelectric polymer can be selected from a poly(vinylidene fluoride) and a poly(vinylidene-co-trifluoroethylene fluoride) copolymer.

Such polymers have good piezoelectric properties allowing the electromechanical performance of the device to be optimised.

The first and the second metal layer may comprise at least one of the metal particles and metal wires, said metal particles and said metal wires preferably being silver particles and silver wires.

Such wires or particles allow to provide good conductivity for applying a polarisation to the active layer while having a flexibility compatible with the mechanical stresses to which the electromechanical device is subjected.

At least one of the first and the second electrode may further comprise a carbon layer covering the corresponding metal layer.

Such a carbon layer allows to absorb, at least part of the deformations applied to the corresponding metal layer, while participating in the electrical conduction of the corresponding electrode.

The active layer may include a plurality of portions each extending along a plane of the electromechanical device parallel to each other, the portions succeeding one another along a direction perpendicular to the plane of the device, two successive portions being at least partially separated from each other by an intermediate electrode layer comprising a poly(3,4-ethylenedioxythiophene) belonging to one of the first and the second electrode such that for two successive intermediate electrode layers, one intermediate electrode layer is comprised in the first electrode and the other intermediate electrode layer is comprised in the second electrode.

With such a configuration, it is possible to add the deformations applied by/or to the active layer portions so as to optimise the performance of the electromechanical device according to the invention.

the active layer may include at least one first opening and at least one second opening for respectively the first electrode and the second electrode, the first opening extending perpendicularly to the plane of the electromagnetic device by intercepting the intermediate electrode layers of only the first electrode and the second opening extending perpendicularly to the plane of the electromagnetic device by intercepting the intermediate electrode layers of only the first electrode, the first electrode further comprising a first interconnection extending into the first opening in contact with the intermediate electrode layers of the first electrode and the second electrode further comprising a second interconnection extending into the first opening in contact with the intermediate electrode layer of the second electrode.

With such interconnections arranged in an opening of the active layer allows to provide polarisation of the intermediate electrode layers in a robust manner and not very sensitive to the deformations to which the active layer is subjected during the operation of the electromechanical device.

the first interconnection and the second interconnection may each comprise at least one poly(3,4-ethylenedioxythiophene).

In this way, the interconnections have elastic properties and are therefore particularly adapted to provide polarisation of the intermediate electrode layers even in the event of significant deformations of the active layer.

The electromechanical device may comprise a first metal track connected to the first electrode and a second metal track connected to the second electrode.

The first metal layer and the first interface layer extend from the first metal track in contact with the active layer and along a perpendicular direction so as to connect the first interconnection and therefore the intermediate electrode layers of the first electrode, the second metal layer and the second interface layer extend from the second metal track in contact with the active layer and along a perpendicular direction so as to connect the second interconnection and therefore the intermediate electrode layers of the second electrode.

The first metal track may comprise at least a first connection track prolonged towards a first main track, and at least a first secondary track connecting the first electrode to the first main track parallel to the first connection track, the second metal track comprising at least a second connection track prolonged towards a first main track, and at least a second secondary track connecting the second electrode to the second main track parallel to the second connection track.

With such secondary tracks, the connection of the first and the second electrode, being redundant, has little risk of being broken even under high mechanical stresses.

The electromechanical device is selected from the group comprising electromagnetic actuators, ferroelectric actuators, electromechanical sensors, such as vibration, shock, or acoustic sensors, mechanical energy recovery devices, and dual components, such as sensors providing haptic feedback.

The invention further relates to a method for manufacturing an electromechanical device comprising the following steps:

formation of a first and second electrodes, the first electrode comprising at least a first metal layer and the second electrode comprising at least a second metal layer, formation of an active layer comprising a ferroelectric polymer, said active layer being disposed between the first and the second electrode in electrical contact with said first and second electrodes.

During the formation of the first electrodes, it is furthermore to form a first and a second interface layer each comprising a poly(3,4-ethylenedioxythiophene) such that the first and the second interface layer are interposed between the active layer and respectively the first and the second metal layer.

Such a method allows the manufacture of an electromechanical device according to the invention and therefore to benefit from the advantages associated therewith.

The step of forming the first and the second electrodes can comprise the following sub-steps:

deposition of at least one prepolymer of poly(3,4-ethylenedioxythiophene), first thermal annealing in order to define the interface layer, deposition of a metal ink, second thermal annealing in order to define the metal layer, global thermal annealing, whether or not the same as one of the first and second thermal annealing, to each form the interface layer and the metal layer.

The step of forming the first and the second electrodes can further comprise the sub-steps of:

deposition of carbon ink, third thermal annealing in order to define the carbon layer, said third annealing may or may not be the same as an overall thermal annealing.

BRIEF DESCRIPTION OF THE DRAWINGS

The present invention will be better understood upon reading the description of exemplary embodiments, given purely in an indicative and non-limiting manner, with reference to the appended drawings wherein.

The different parts shown in the figures are not necessarily at a uniform scale, to make the figures more readable.

The different possibilities (variants and embodiments) should be understood as not being mutually exclusive and can be combined with each other.

DESCRIPTION OF EMBODIMENTS

Figure 3:
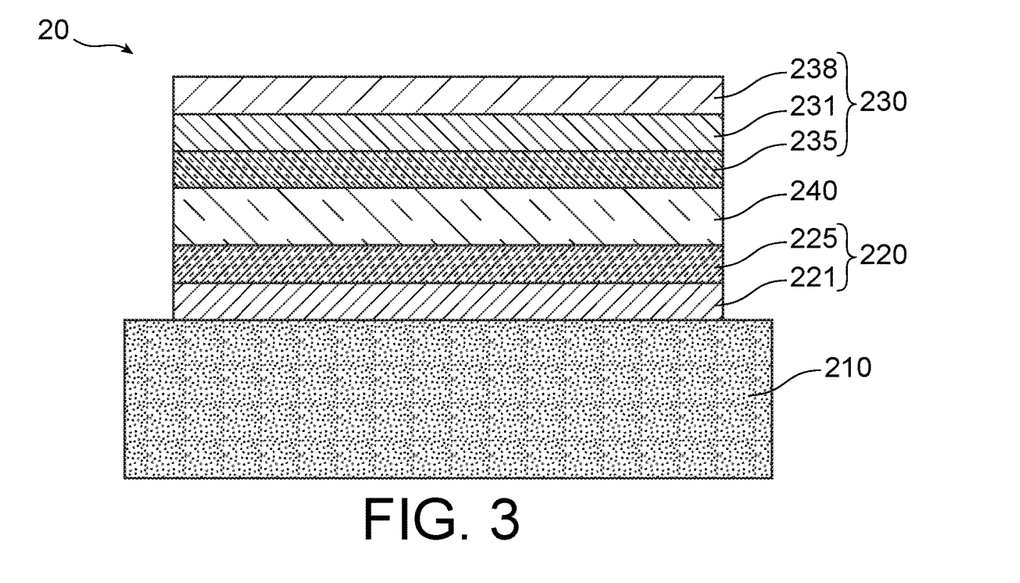
FIG. 3 illustrates in schematic sectional view a principle view of an electromechanical device according to the invention.

FIG. 3 shows a schematic sectional view of a principle view of an electromechanical device 10 according to the invention.

Such an electromechanical device 10 comprises:

a support 210, first and second electrodes 220, 230, an active layer 240 comprising at least one ferroelectric polymer, said active layer 240 being disposed between the first and the second electrode 220, 230 in electrical contact with said first and second electrodes 220, 230.

According to the principle of the invention, the first electrode 220 comprises a first metal layer 221 and a first interface layer 225, the first interface layer 225 being interposed between the active layer 240 and the first metal layer 221. Such a configuration wherein the first interface layer 225 is interposed between the active layer 240 and the first metal layer 221 allows the first interface layer 225 to separate the active layer 240 from the metal layer 221. In this way the active layer 240 does not come into contact with the first metal layer 221.

The second electrode 220 comprises a second metal layer 231 and a second interface layer 235, the second interface layer 235 being interposed between the active layer 240 and the first metal layer 231. Such a configuration wherein the second interface layer 235 is interposed between the active layer 240 and the second metal layer 231 allows the second interface layer 225 to separate the active layer 240 from the second metal layer 231. In this way the active layer 240 does not either come into contact with the second metal layer 231.

The second electrode layer 220 further comprises, as illustrated in FIG. 3, a second carbon layer 238, such as a graphene or graphite layer, in order to passivate the parts of the second metal layer 231 which are not in contact with the second interface layer 235.

Thus, more specifically, the support 210 can be, for example, a glass or quartz support or else a flexible printed circuit surface, such as a support made of polyimide or PolyEtherEtherKetone, better known by the abbreviation PEEK. The support can also be a polycarbonate, PC or a poly(ethylene naphthalate), PEN, or else a paper support.

The first metal layer 221 is, according to the configuration illustrated in FIG. 3, disposed in contact with the support 210 by being connected with a conductive track not shown.

The first metal layer 221 can comprise at least one of the metal particles, such as silver particles, and metal wires, such as silver wires. The first metal layer 221 can thus, for example, be a metal layer produced by depositing a metal ink comprising said metal particles and/or metal wires and a solvent. In a particularly advantageous application of the invention, the first metal layer can be made from a silver ink comprising silver particles and/or silver wires. The first metal layer 221 may have a thickness comprised between 500 nm and 15 µm, the latter preferably being comprised between 1 µm and 7.5 µm or even between 2 µm and 4 µm. Thus the first metal layer 221 can advantageously have a thickness of 3 µm.

The first metal layer 221 is covered by the first interface layer 225.

The first interface layer 225 comprises a poly(3,4-ethylenedioxythiophene). Thus the first interface layer 225 can be made of only poly(3,4-ethylenedioxythiophene), better known by the abbreviation PEDOT or can comprise an alloy comprising PEDOT, such as an alloy of poly(3,4-ethylenedioxythiophene) and poly(sodium styrene sulfonate), better known by the abbreviation PEDOT-PSS, an alloy of poly (3,4-ethylenedioxythiophene) and tetramethylacrylate, better known by the abbreviation PEDOT-TMA, an alloy of poly(3,4-ethylenedioxythiophene) and polyaniline, better known by the abbreviation PEDOT-PANI.

The first interface layer 255 has a thickness comprised between 200 nm and 3 µm, preferably comprised between 500 nm and 2 µm, or even between 750 nm and 1.5 µm. The first interface layer 225 can thus advantageously have a thickness of 1 µm.

The first interface layer 225, being interposed between the first metal layer 221 and the active layer 240, it is covered by the active layer 240.

The active layer 240 is a layer comprising at least one ferroelectric polymer such as a poly(vinylidene fluoride) or a poly(vinylidene-co-trifluoroethylene fluoride) copolymer.

The active layer 240 is in turn covered by the second electrode 230 such that the active layer 240 is disposed between the first and the second electrode 220, 230 in electrical contact with said first and second electrodes 220, 230.

The second interface layer 235 and the second metal layer 231 have a configuration similar respectively to the first interface layer 225 and the first metal layer 221.

Additionally, the second electrode 220 further comprises the second carbon layer 238 which covers the metal layer 231 on the surface of the latter which is free of the second interface layer 225. The carbon layer 228 has a thickness comprised between 1 μm and 15 μm, preferably comprised between 3 μm and 12 μm, or even between 5 μm and 10 μm. The second carbon layer 238 can thus advantageously have a thickness of 1 μm.

Such an electromechanical device 20 according to the principle of the invention can be produced from a manufacturing method comprising the following steps:
provision of the support 210,
formation of the first electrode 220 in contact with the support 210,
formation of the active layer 240 in contact with the first electrode,
formation of the second electrode 230 in contact with the active layer.

In such a manufacturing method, the step of forming the first electrode 220 may comprise the following sub-steps:
deposition of the first metal layer 221 by, for example, screen printing a metal ink such as silver ink,
a first thermal annealing of the first metal layer 221 in order to define the first metal layer 221,
deposition of a prepolymer for forming the poly(3,4-ethylenedioxythiophene) or the alloy including it in contact with the first metal layer 221,
a second thermal annealing in order to prepolymerise the prepolymer and define the first interface layer 225.

It will be noted that the formation of the first electrode 220 is completed by a global annealing allowing in particular to obtain the polymerisation of the first interface layer 225.

The step of forming the active layer 240 may comprise the following sub-steps:
deposition of a prepolymer of the at least one ferroelectric polymer,
a third thermal annealing so as to define the active layer 240.

The step of forming the second electrode 230 may comprise the following sub-steps:
deposition of a prepolymer for forming the poly(3,4-ethylenedioxythiophene) or the alloy including it in contact with the active layer 240, this deposition being carried out, for example, by screen printing,
a fourth thermal annealing in order to prepolymerise the prepolymer and define the second interface layer 235,
deposition of the second metal layer 231 in contact with the second interface layer 235, by, for example, screen printing a metal ink such as silver ink,
a fifth thermal annealing of the second metal layer 231 in order to define the second metal layer 231,
deposition of carbon in contact with the second metal layer 231, said deposition being able to be carried out by screen printing a carbon ink such as graphite ink or graphene ink,
global annealing in order to form the second carbon layer 238 from the deposited carbon and the first and second metal layer 221, 213 and to polymerise the active layer 240 and the first and second interface layer 225, 235 in order to form them.

Thus, the electromechanical device 20 is formed after this last global annealing.

The first to fifth thermal annealings can for example be annealings of a duration comprised between 3 min and 5 min at a temperature comprised between 100° C. and 120° C. The global annealing can, for example, be an annealing of a duration of 30 min at a temperature of 150° C.

Figure 4:
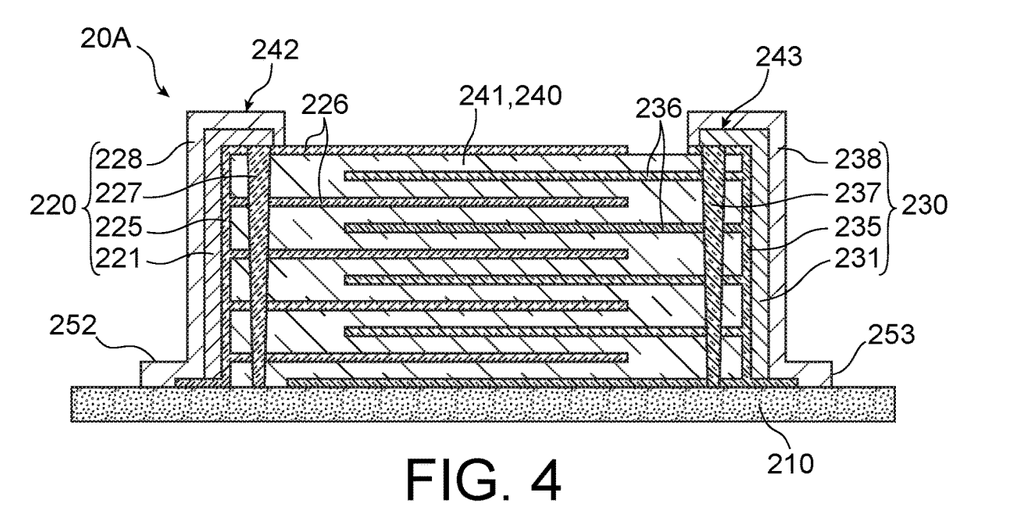
FIG. 4 illustrates a sectional view of a device according to a first embodiment of the invention, FIGS. 5A and 5B respectively illustrate in top view and in sectional view a device according to a second embodiment of the invention.

FIG. 4 illustrates in sectional view an electromechanical device 10A according to a first practical embodiment of the invention wherein the active layer 240 has a multi-stage configuration, similar to those of the prior art illustrated in FIGS. 2A and 2B so as to optimise the performance of the electromechanical device 10A.

Such an electromechanical device 10A thus has the active layer 240 including a plurality of portions 241 each extending along a plane of the electromechanical device parallel to each other, the portions 241 succeeding each other along a direction perpendicular to the plane of the device. Two successive portions 241 of the active layer are at least partially separated from each other by an intermediate electrode layer 226, 236 belonging to one of the first and the second electrode 220, 230 such that for two successive intermediate electrode layers 226, 236, one intermediate electrode layer 226 is comprised in the first electrode 220 and the other intermediate electrode layer 236 is comprised in the second electrode 230.

In order to allow connection of the intermediate electrode layers 226, 236, the active layer 240 has at least one first opening 242 and at least one second opening 243 for respectively the first electrode 220 and the second electrode 230. The first opening 242 extends perpendicularly to the plane of the electromagnetic device 20A by intercepting the intermediate electrode layers 226 of only the first electrode 220. The second opening 243 extends perpendicular to the plane of the electromagnetic device 20 by intercepting the intermediate electrode layers 236 of only the first electrode 230.

The first electrode 220 further comprises a first interconnection 227 extending into the first opening 242 in contact with the intermediate electrode layers 226 of the first electrode 220. Similarly, the second electrode 230 further comprises a second interconnection 237 extending into the second opening 243 in contact with the intermediate electrode layers 236 of the second electrode 230.

In this embodiment, the first interconnection 227 and the second interconnection are made of PEDOT or an alloy comprising PEDOT or an alloy such as a PEDOT-PSS, PEDOT-TMA or PEDOT-PANI alloy.

Similarly, each of the intermediate electrode layers 226, 236 are made of PEDOT or an alloy comprising PEDOT or an alloy such as a PEDOT-PSS, PEDOT-TMA or PEDOT-PANT alloy.

In order to allow connection of the first interconnection 227, the first electrode 220 comprises the first interface layer 225, the first metal layer 221 and a first carbon layer 228. The first interface layer 225, the first metal layer 221 and the first carbon layer extend from at least a first metal track 252 of the support 210 in contact with one side of the active layer 240 and along a perpendicular direction so as to connect the first interconnection 227 and therefore the intermediate electrode layers 226 of the first electrode 220.

In such a configuration, in accordance with the invention, the first interface layer 225 is in contact with the active layer 240, the first metal layer 221 being in contact with the first interface layer 225 and the first carbon layer 228 covering the surface of the first metal layer 221 free of the first interface layer 225.

The second electrode 230, having a configuration similar to that of the first electrode 220, it includes the second interface layer 235, the second metal layer 231 and the second carbon layer 238. The layers 235, 231, 238 of the second electrode extend from at least a second metal track 253 of the support 210 in contact with one side of the active layer 240 and along a perpendicular direction so as to connect the second interconnection 237 and therefore the intermediate electrode layers 236 of the second electrode 230.

The second interface layer 235 is in contact with the active layer 240, the second metal layer 231 being in contact with the second interface layer 235 and the second carbon layer 238 covering the surface of the second metal layer 231 free of the second interface layer 235.

Thus, with such a configuration, the use of interconnections 227, 237 arranged in the active layer 240 allows to ensure a robust connection of the intermediate electrode layers 226, 236.

A method for manufacturing an electromechanical device 10A according to this first embodiment differs from a method for manufacturing an electromechanical device 10 according to the principle of the invention in that:

during the step of forming the active layer 240, the active layer 240 has the first and second opening 242, 243 and provision is made of the following sub-steps, which are reproduced successively until the formation of the active layer 240 of:
  deposition of a prepolymer of the at least one ferroelectric polymer corresponding to a portion 241 of the active layer 240,
  a first intermediate thermal annealing so as to define the portion 241 of active layer 240,
  deposition of a prepolymer of poly(3,4-ethylenedioxythiophene) or of the alloy including it in contact with said portion 241 of active layer 240,
  a second intermediate thermal annealing so as to define an intermediate electrode layer 226, 236,
the steps of forming the first and the second electrode 220, 230 are subsequent to the step of forming the active layer 240 and are carried out in parallel with each other,
the steps of forming the first and the second electrode 220, 230 comprise:
  deposition of the prepolymer of poly(3,4-ethylenedioxythiophene) or of the alloy including it in contact with a first and a second side of the first active layer and in the first and second opening 242, 243, this deposition being carried out, for example, by screen printing,
  a first thermal annealing in order to prepolymerise the prepolymer and define the first and second interface layers 225, 235 and the first and second interconnections,
  deposition of the first and the second metal layer 221, 231 in contact with, respectively, the first and second interface layer 225, 235, for example, by screen printing a metal ink such as a silver ink,
  a second thermal annealing of the first and of the second metal layer 221, 231 in order to respectively define the first and the second metal layer 221, 231,
  deposition of carbon in contact with the first and the second metal layer 221, 231, said deposition being able to be carried out by screen printing a carbon ink, a graphite ink or a graphene ink,
  global annealing in order to form the first and second carbon layers 238 from the deposited carbon and the first and second metal layers 221, 213 and polymerise the active layer 240, the first and second interface layer 225, 235, the first and second interconnection 227, 237 and the intermediate electrode layers 226, 236.

In a manner similar to the method for manufacturing an electromechanical device 10 according to the principle of the invention, the first and second thermal annealings and the first and second intermediate thermal annealings can be annealings of a duration comprised between 3 min and 5 min at a temperature comprised between 100° C. and 120° C. The global annealing can be, for example, an annealing of a duration of 30 min at a temperature of 150° C.

Figure 5A:
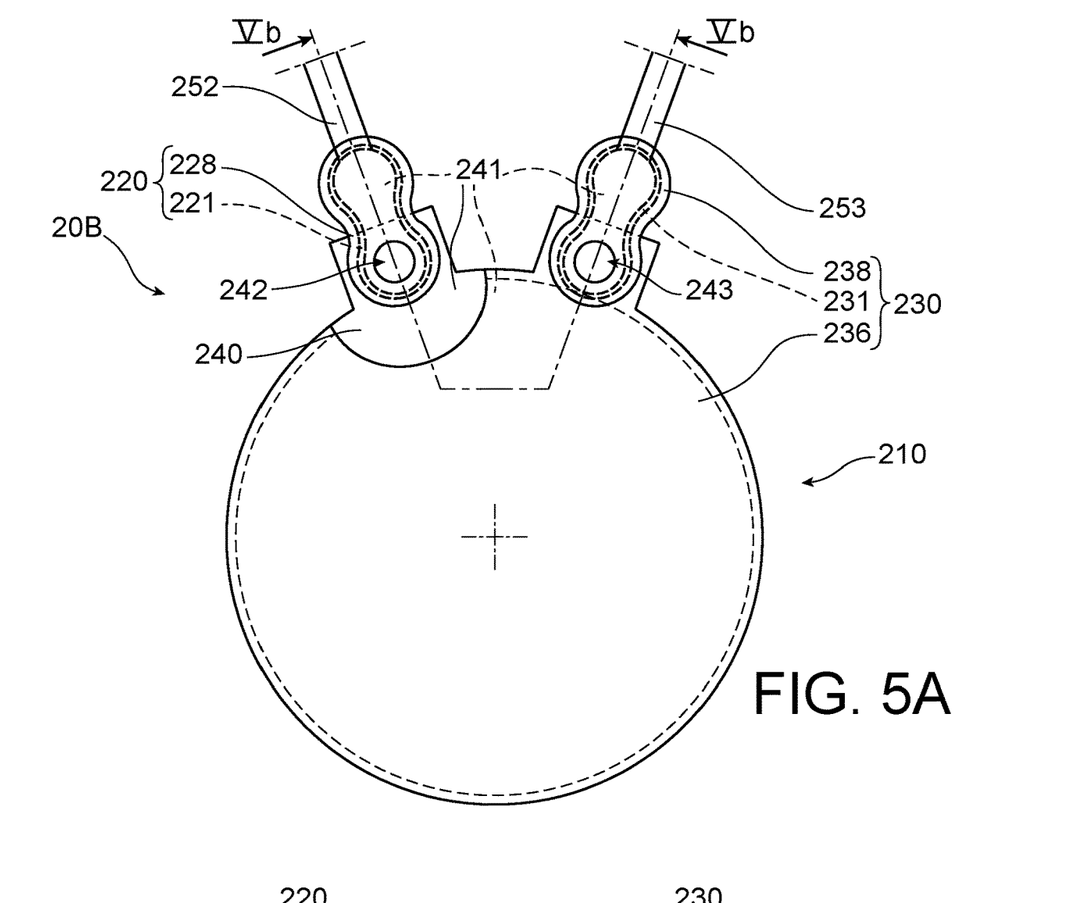
Figure 5B:
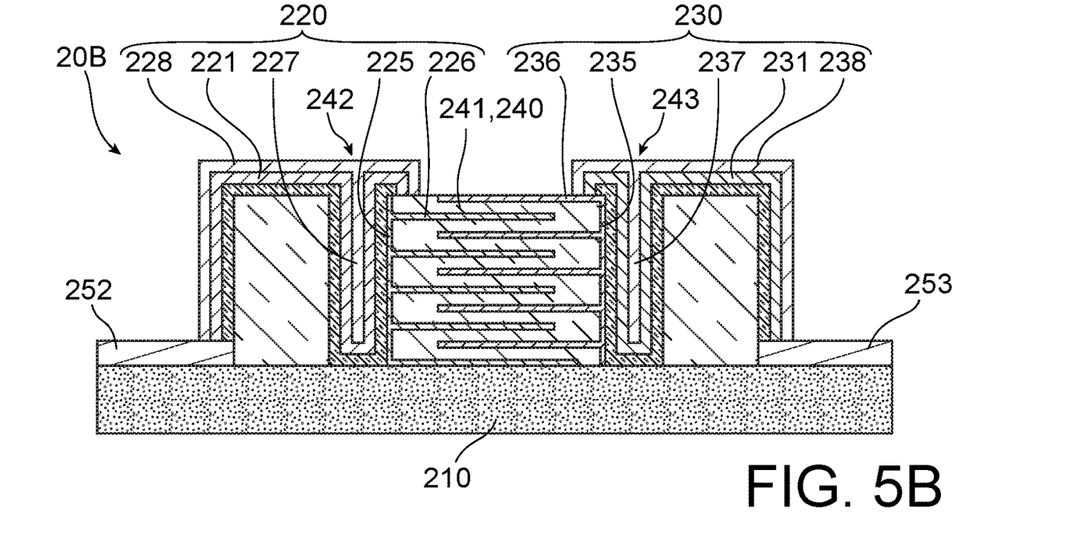

FIGS. 5A and 5B illustrate in sectional view an electromechanical device 10B according to a second practical embodiment of the invention wherein the first and second interconnections 227, 237 have a multi-stage conformation similar to the rest of the first and the second electrode.

An electromechanical device 10B according to a second embodiment differs from an electromechanical device 10A according to the first embodiment only by configuration of the first and the second interconnection 227, 237.

It will be noted that, in accordance with the illustration of FIG. 5A which shows the electromechanical device 10B according to this second embodiment, the first and second metal tracks 252, 253 are disposed side by side so as to dispose the first and second metal layers 221, 231 on the same side of the active layer 240. Such an arrangement allows to constrain the displacement of the active layer 240 only on one side, that used for its connection, allowing to optimise the ferroelectric performance unlike this contact.

Thus, in such an electromechanical device 10B, the first and the second opening 242, 243 are dimensioned to receive both the first/second interface layer 225/235, the first/second metal layer 221/231 and the first/second carbon layer 228/238.

Therefore, as shown in FIG. 5B, the first interconnection 227 comprises:
  a portion of the first interface layer 225 in contact with the active layer 240, and therefore intermediate electrode layers 226 corresponding to the first electrode 220, on the inner wall of the first opening 242,
  a portion of the first metal layer 221 in contact with the portion of the first interface layer 225,
  a portion of the first carbon layer 228 covering the parts of the portion of the first metal layer 221 free of the first interface layer 225.

Identically, the second interconnection 237 comprises:
  a portion of the second interface layer 235 in contact with the active layer 240, and therefore intermediate electrode layers 236 corresponding to the first electrode 230, on the inner wall of the second opening 243,
  a portion of the second metal layer 231 in contact with the portion of the second interface layer 235,
  a portion of the second carbon layer 238 covering the parts of the portion of the second metal layer 231 free of the first interface layer 235.

With such a configuration, both good mechanical strength of the first and second interconnection 227, 237 during operation of the electromechanical structure 10B and good electrical connection between the intermediate electrode layers 226, 236 and the metal tracks 252, 253 are ensured.

A method for manufacturing an electromechanical device 10B according to this second practical embodiment of the invention differs from a method for manufacturing the electromechanical device 10A according to the first practical embodiment of the invention in that:
  when forming the active layer 240, the first and second opening 242, 243 have, in the plane of the electromechanical device 2, a lateral section the minimum dimension of which is greater than or equal to the sum of twice the thicknesses of the first interface layer 225 and the first metal layer 221,
  when forming the first and the second electrode, the deposition of the first and of the second metal layer 221, 231 and the deposition of carbon are also carried out in the first and second opening 242, 243 in contact with, respectively, the first and second interface layer 225, 235 and the first and second metal layer 221, 231.

Figure 6:
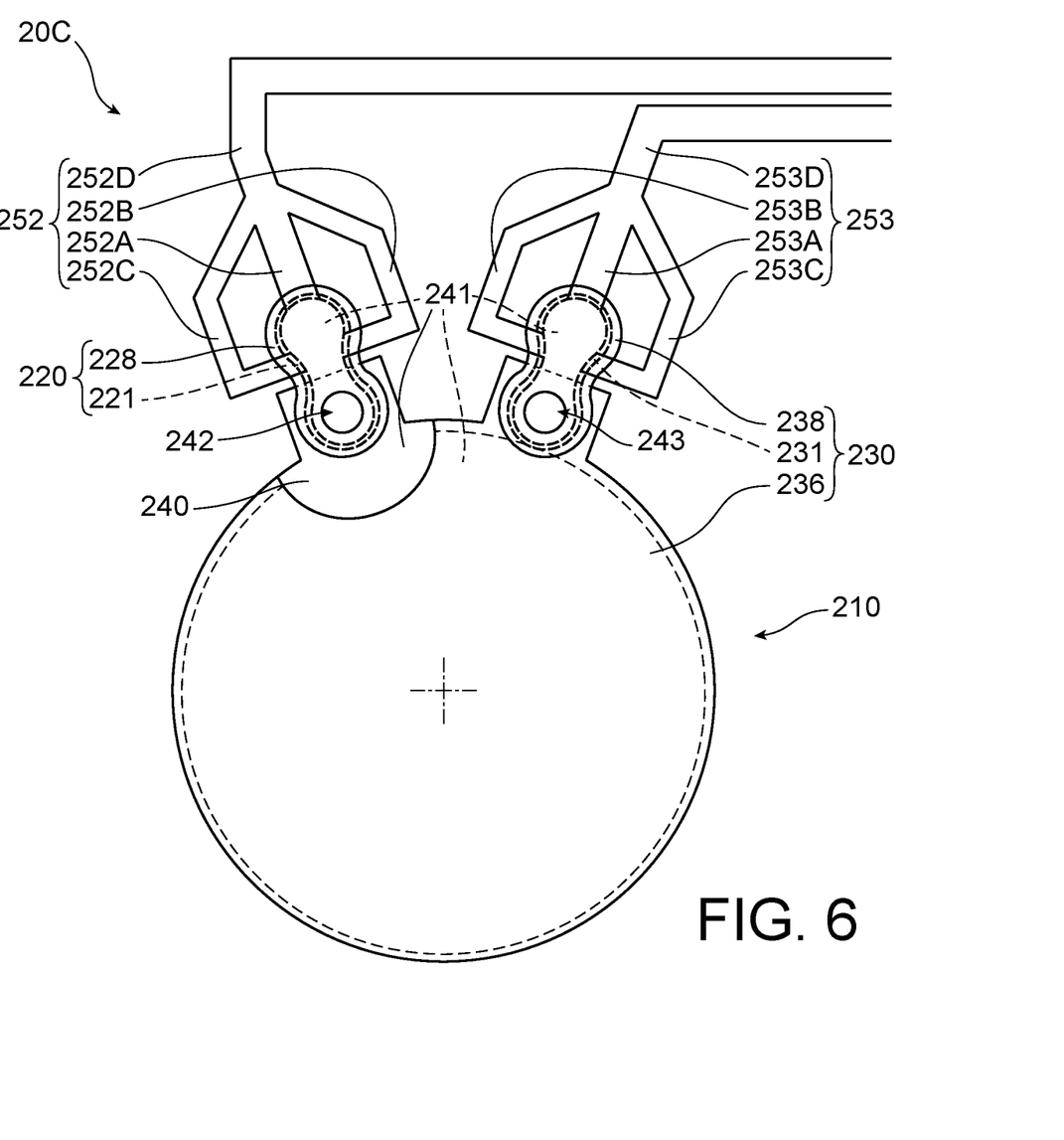
FIG. 6 illustrates in sectional view of a device according to a third embodiment of the invention, Identical, similar or equivalent parts of the different figures bear the same reference numerals so as to facilitate the passage from one figure to another.

FIG. 6 illustrates a top view of an electromechanical device 10C according to a variant of this second practical embodiment of the invention wherein the first and the second metal track 252, 253 are redundant in order to ensure a connection of the electrode in the event of breaking the track at the electrode 220, 230.

Thus, an electromechanical device 10C according to this variant differs from the electromechanical device 10B according to the second practical embodiment of the invention in that the first and second mechanical tracks 252 and 253 have a redundant configuration.

As illustrated in FIG. 6, the first metal track 252 comprises:
- a first connection track 252A, extending from the first electrode 220 and prolonged towards a first main track 252D,
- a first and a second secondary track 252B, 252C, extending from the first electrode 220 on either side of the first connection track 252A to connect the first main track 252D,
- the first main connection track 252D.

Identically, the second metal track 253 comprises:
- a second connection track 253A, extending from the second electrode 230 and prolonged towards a first main track 253D,
- a third and a fourth secondary track 253B, 253C, extending from the second electrode 230 on either side of the second connection track 253A to connect the first main track 252D,
- the second main connection track 253D.

The invention claimed is:

1. An electromechanical device comprising:
   first and second electrodes, the first electrode comprising at least a first metal layer and the second electrode comprising at least a second metal layer,
   an active layer comprising at least one ferroelectric polymer, the active layer being disposed between the first and the second electrode in electrical contact with said first and second electrodes,
   wherein the first electrode and the second electrode respectively comprise a first and a second interface layer the first and second interface layer each comprising poly(3,4-ethylenedioxythiophene),
   wherein the first interface layer is interposed between the active layer and the first metal layer separating them from each other, wherein the second interface layer is interposed between the active layer and the second metal layer separating them from each other.

2. The electromechanical device according to claim 1, wherein each of the first and second interface layer further comprises poly(sodium styrene sulfonate), tetramethylacrylate and/or polyaniline.

3. The electromechanical device according to claim 1, wherein the at least one ferroelectric polymer is selected from a poly(vinylidene fluoride) and a poly(vinylidene-co-trifluoroethylene fluoride) copolymer.

4. The electromechanical device according to claim 1, wherein the first and second metal layer comprises at least one of the metal particles and metal wires.

5. The electromechanical device according to claim 4, wherein the metal particles and/or the metal wires comprise silver.

6. The electromechanical device according to claim 1, wherein at least one of the first and the second electrode further comprises a carbon layer covering the corresponding metal layer.

7. The electromechanical device according to claim 1, wherein the active layer includes a plurality of portions each extending along a plane of the electromechanical device parallel to each other, the portions succeeding one another along a direction perpendicular to the plane of the electromechanical device, two successive portions being at least partially separated from each other by an intermediate electrode layer comprising a poly(3,4-ethylenedioxythiophene), each of the intermediate electrode layers belonging to one of the first and the second electrode such that for two successive intermediate electrode layers, one intermediate electrode layer is comprised in the first electrode and the other intermediate electrode layer is comprised in the second electrode.

8. The electromechanical device according to claim 7, wherein the active layer includes at least one first opening and at least one second opening for respectively the first electrode and the second electrode, the first opening extending perpendicularly to the plane of the electromagnetic device by intercepting the intermediate electrode layers of only the first electrode and the second opening extending perpendicularly to the plane of the electromagnetic device by intercepting the intermediate electrode layers of only the first electrode,
   the first electrode further comprising a first interconnection extending into the first opening in contact with the intermediate electrode layers of the first electrode and the second electrode further comprising a second interconnection extending into the first opening in contact with the intermediate electrode layer of the second electrode.

9. The electromechanical device according to claim 8, wherein the first interconnection and the second interconnection each comprise at least one poly(3,4-ethylenedioxythiophene).

10. The electromechanical device according to claim 1, further comprising a first metal track connected to the first electrode and a second metal track connected to the second electrode.

11. The electromechanical device according to claim 7, further comprising a first metal track connected to the first electrode and a second metal track connected to the second electrode,
   wherein the first metal layer and the first interface layer extend from the first metal track in contact with the active layer and along a perpendicular direction so as to connect the first interconnection and therefore the intermediate electrode layers of the first electrode,
   the second metal layer and the second interface layer extend from the second metal track in contact with the active layer and along a perpendicular direction so as to connect the second interconnection and therefore the intermediate electrode layers of the second electrode.

12. The electromechanical device according to claim 10, wherein the first metal track comprises a first main track, at least a first connection track prolonged towards the first main track to connect the first main track to the first electrode, and at least a first secondary track connecting the first electrode to the first main track parallel to the first connection track,
   and wherein the second metal track comprises a second main track, at least one second connection track prolonged towards the second main track to connect the second main track to the second electrode, and at least a second secondary track connecting the second electrode to the second main track parallel to the second connection track.

13. A method for manufacturing an electromechanical device comprising the following steps:
    formation of a first and second electrodes, the first electrode comprising at least a first metal layer and a second electrode comprising at least a second metal layer,
    formation of an active layer comprising a ferroelectric polymer, said active layer being disposed between the first and the second electrode in electrical contact with said first and second electrodes,
    wherein during the formation of the first electrode it is furthermore to form a first and a second interface layer each comprising a poly(3,4-ethylenedioxythiophene) such that the first interface layer is interposed between the active layer and the first metal layer separating them from each other and that the second interface layer is interposed between the active layer and the second metal layer separating them from each other.

14. The manufacturing method according to claim 13, wherein the step of forming the first and the second electrodes comprises the following sub-steps:
    deposition of at least one prepolymer of poly(3,4-ethylenedioxythiophene),
    first thermal annealing in order to define the interface layer,
    deposition of a metal ink,
    second thermal annealing in order to define the metal layer,
    global thermal annealing, whether or not the same as one of the first and second thermal annealing, to each form the interface layer and the metal layer.

15. The manufacturing method according to claim 13, wherein the step of forming the first and the second electrodes further comprises the sub-steps of:
    deposition of carbon ink,
    third thermal annealing in order to define the carbon layer, said third annealing may or may not be the same as an overall thermal annealing.

* * * * *